United States Patent

Kuehne et al.

[11] Patent Number: 6,146,975
[45] Date of Patent: Nov. 14, 2000

[54] SHALLOW TRENCH ISOLATION

[75] Inventors: Stephen Carl Kuehne; Alvaro Maury, both of Orlando, Fla.

[73] Assignee: Lucent Technologies Inc., Murray Hill, N.J.

[21] Appl. No.: 09/113,583

[22] Filed: Jul. 10, 1998

[51] Int. Cl.[7] .............................. H01L 21/76; H01L 29/00
[52] U.S. Cl. ..................... 438/437; 438/436; 438/435; 438/433; 438/427; 438/424; 438/401; 438/296; 257/510
[58] Field of Search ..................................... 438/424, 437, 438/436, 435, 433, 427, 425, 401, 296, 294, 243; 257/522, 510

[56] References Cited

U.S. PATENT DOCUMENTS 5,362,669  11/1994  Boyd et al. .............................. 438/437
6,001,706  12/1999  Tan et al. .................................. 438/424

*Primary Examiner*—David Hardy
*Assistant Examiner*—Jose R Diaz
*Attorney, Agent, or Firm*—Thomas, Kayden, Horstemeyer & Risley, L.L.P.

[57] ABSTRACT

The specification describes a dual patterned polish stop layer technique for shallow trench isolation. The shallow trenches are formed by etching trenches in a semiconductor substrate wafer, backfilling with oxide, and polishing by chemical-mechanical polishing (CMP) to produce a planar, trench isolated, wafer. To ensure planarity of the wafer after CMP, and avoid dishing of the field oxide, a dual silicon nitride polish stop layer is used. The first polish stop layer is applied selectively to protect the active device regions, and the second polish stop layer is applied selectively to protect the field oxide regions.

12 Claims, 4 Drawing Sheets

SHALLOW TRENCH ISOLATION

FIELD OF THE INVENTION

This invention relates to methods for isolating circuits and circuit elements in semiconductor integrated circuit substrates. More particularly it relates to shallow trench isolation (STI) in which shallow trenches of insulating material are formed in the semiconductor substrate.

BACKGROUND OF THE INVENTION

Isolation of electrical signals in IC devices has been thoroughly addressed in the prior art, and a variety of approaches have developed. Complete isolation has been achieved in power ICs with dielectrically isolated structures. In this technique buried oxide tubs are formed around a silicon substrate region. The typical fabrication method is to etch deep trenches in a single crystal silicon substrate, oxidize the silicon in the trenches, and deposit a thick layer of polysilicon over the etched silicon surface. The polysilicon layer serves as the substrate or "handle" for the wafer during subsequent processing to form the integrated circuit. The bottom surface of the single crystal silicon wafer is polished away to reveal the oxide trenches thus leaving isolated islands of single crystal silicon in the polysilicon handle wafer. This approach is effective, but costly, and it consumes significant chip area. Junction isolation, i.e. guard rings, is the technique of choice in densely packed VLSI devices. Junction isolation is effective in blocking stray signals that propagate in the vicinity of the surface of the device. It is widely used in combination with the LOCOS process in commercial manufacture of LSI and VLSI MOS integrated circuits.

Another approach to dealing with interference in the substrate is to increase the resistivity of the substrate. Silicon on sapphire (SOS) and similar technologies have been developed which provide a high degree of isolation, but these types of wafers are difficult to process and are not economical for many applications.

In an effort to develop more robust isolation techniques, methods for forming surface regions of insulating material between devices but extending substantially into the substrate have been explored. The LOCOS process provides oxide regions that extend below the surface of the substrate. However, deeper oxide regions would be expected to be more effective, especially if they extend through, or largely through, the thickness of the active epitaxial device layer. In the early 1980s, techniques using deep trenches between circuit components were developed. V-groove trenches can be formed easily using crystallographic etching, but V-grooves were found to consume excessive chip area. The advent of effective anisotropic plasma etching techniques advanced this technology in that narrow trenches a few microns deep, with high aspect ratios, could be routinely formed. This allowed the chip area for the trenches to be reduced.

More recently, shallow trench isolation (STI) has been developed. Integrated circuits that operate with low voltages, i.e. 5 volts or less, and with shallow junctions, can be isolated effectively with relatively shallow trenches, i.e. less than a micron. In STI technology, the trench is back-filled with oxide and planarized using chemical-mechanical polishing (CMP). The result is a more planar structure than is typically obtained using LOCOS, and the deeper trench (as compared with LOCOS) provides superior latch up immunity. Also, by comparison with LOCOS, it has a much reduced "birds' beak" effect and thus theoretically provides a higher packing density for circuit elements on the chip.

The drawbacks in STI technology to date relate mostly to the planarizing process. Achieving acceptable planarization across the full diameter of a wafer using traditional etching processes has been largely unsuccessful. It has been proposed to use chemical-mechanical polishing (CMP) in which the wafer is polished using a mechanical polishing wheel and a slurry of chemical etchant. This technique successfully removes the unwanted oxide material but it also consumes the surface portions of the field oxide that are to remain as the isolating means, resulting in a "dishing" effect. Dishing destroys the planarity of the wafer and thus interferes with subsequent processing.

A proposal to overcome the dishing produced by the CMP step in STI technology is given in U.S. Pat. No. 5,362,669. The essential feature of this proposal is the use of a silicon nitride polish stop layer on the silicon active device regions prior to deposition of the fill oxide, and another silicon nitride layer over the fill oxide prior to the CMP step. If the level of the recess in the fill oxide matches the surface of the silicon substrate an essentially continuous nitride layer is available to stop, or sufficiently slow, the CMP when the surface is planar. This approach is conceptually sound, but in practice yields variable results which are due largely to the presence of the blanket layer of silicon nitride, and the excessive impedance of this layer during the CMP etch.

SUMMARY OF THE INVENTION

We have developed an improved CMP etch process for STI technology. The improved CMP process involves a dual layer polish stop technique in which both polish stop layers are selectively placed on the areas of the fill oxide layer where they are most effective.

DETAILED DESCRIPTION

Figure 1:
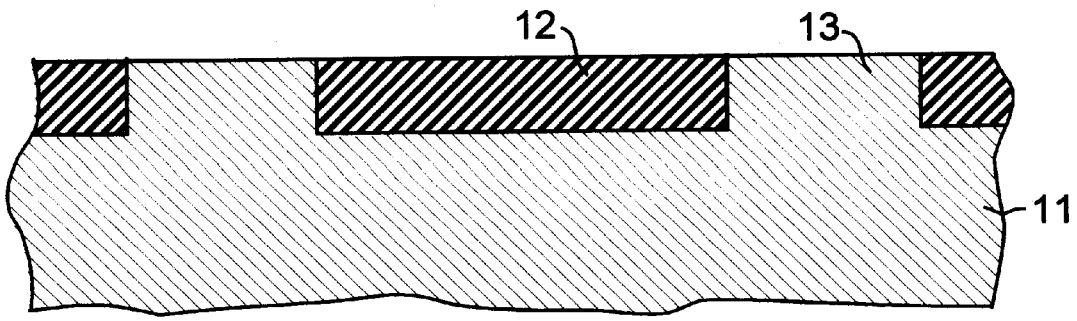
FIG. 1 is a schematic diagram of a portion of a shallow trench isolated wafer.

With reference to FIG. 1 a semiconductor wafer 11 is shown with shallow isolation trenches 12. The semiconductor regions 13 between the isolation trenches 12 are the active device sites. In principle, any semiconductor substrate can be processed using the isolation technique of the invention. In the most likely commercial embodiment the substrate will be silicon.

The trenches are typically of the order of 300–500 nm but could range from 200–1000 nm depending on the technology being used. The x-y dimensions of the isolation trenches depends on the portion of the field oxide of the integrated circuit that is being viewed. In the portion shown in FIG. 1 the field oxide region is relatively large compared to the active region. It is in this part of the wafer that the problem of dishing of the field oxide during CMP is most severe. In some cases the field oxide after CMP may be essentially destroyed.

The foregoing problem of dishing during CMP is addressed according to the invention by the use of two selected area polish stop layers. A typical process sequence according to the invention is described in conjunction with FIGS. 2–11.

Figure 2:
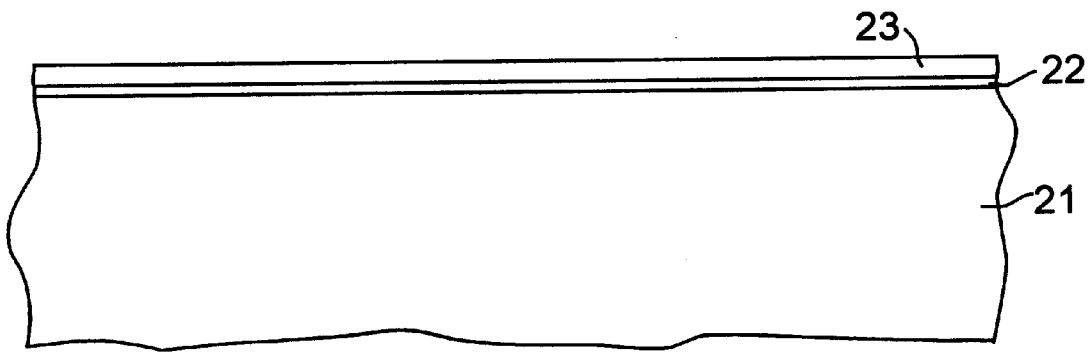
FIGS. 2–11 are schematic representations of process steps used, according to the invention, to produce the shallow trench isolated wafer of FIG. 1.

With reference to FIG. 2, a silicon substrate 21 is shown covered with pad oxide 22 and the first silicon nitride polish stop layer 23. The pad oxide is a thermally grown thin oxide, typically 10–30 nm, that is conventionally used under nitride layers to facilitate nitride removal. The first polish stop layer 23 is deposited by CVD, preferably LPCVD, to a thickness in the range 50–300 nm. This first polish stop layer is to protect the active device regions. The thickness required for the first polish stop layer is dependent on the polish selectivity between the polish stop layer and the fill oxide material for the trenches.

Figure 3:
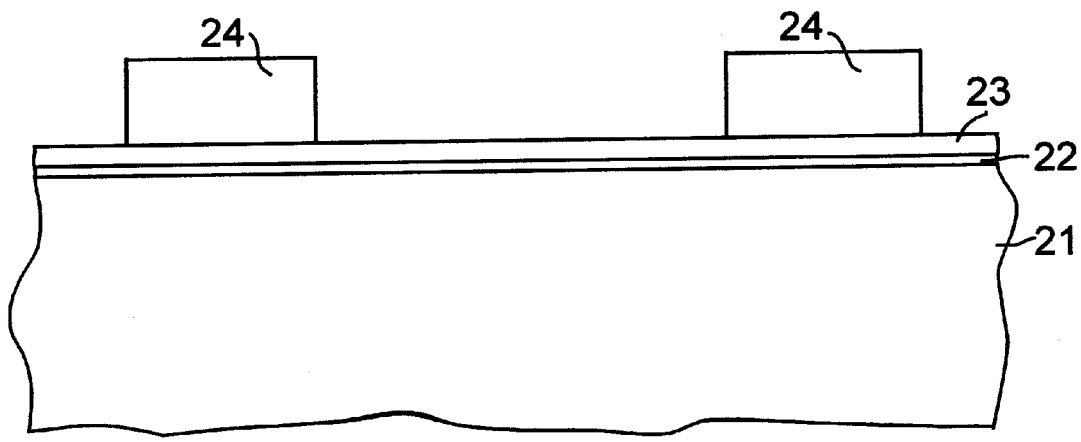
Figure 4:
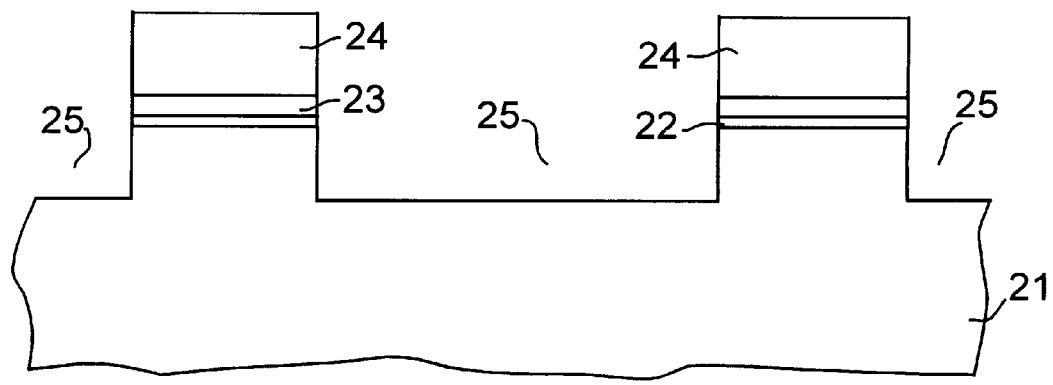

The active device regions of the wafer are then masked with lithographic mask 24, typically a photoresist, as shown in FIG. 3, and plasma etched to remove the exposed nitride, pad oxide, and the underlying silicon to the desired depth of the isolation trench. The etched wafer with is shown in FIG. 4 with the trenches designated 25. The photoresist is then stripped.

Other step sequences may be devised to produce the structure of FIG. 4 but it will be appreciated by those skilled in the art that the sequence described results in active device regions that are self-aligned with the first polish stop layer 23.

Figure 5:
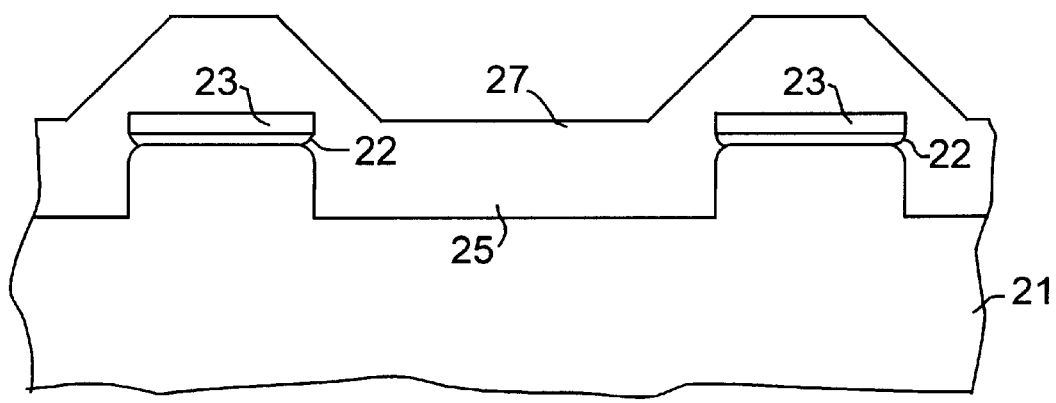

At this point, and with reference to FIG. 5, a thin oxide liner of the order of 50–500 Angstroms is grown on the exposed silicon to provide a high quality Si/SiO2 interface, and to round the corners of the active device regions. The trenches are then filled with oxide by blanket depositing a thick silicon dioxide layer 27. Oxide layer 27 is preferably deposited by high density plasma (HDP) although other methods, e.g. conventional CVD, can be used. The thickness of the fill oxide at this point in the process preferably exceeds the trench depth by 10–50%. It is also expedient to have the surface of the fill oxide in the trenches at approximately the level of the first nitride polish stop layer. This can be expressed as:

$$t \cong d+p+n_1$$

where t is the thickness of the fill oxide layer, d is the depth of the trench, p is the thickness of the pad oxide, and $n_1$ is the thickness of the first nitride polish stop layer. For the most robust process it is believed that the surface of the fill oxide layer should be just below the surface of the first nitride polish stop layer. This can be expressed as:

$$t=x(d+p+n_1)$$

where x is less than 1, and preferably in the range 0.9–0.99.

Figure 6:
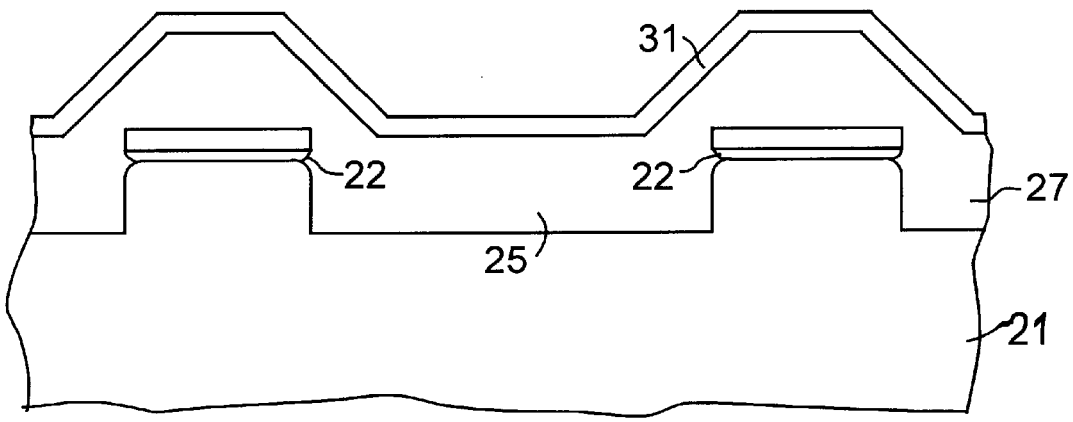
Figure 7:
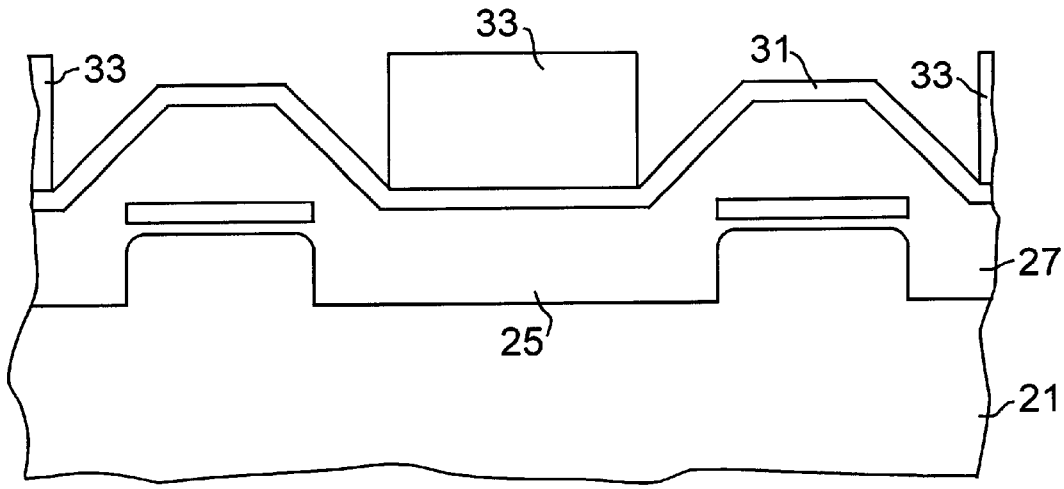
Figure 8:
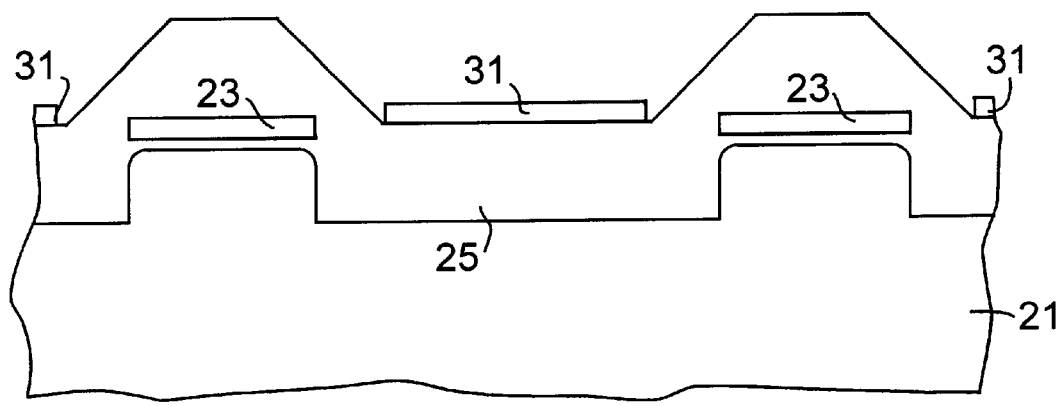

The second nitride polish stop layer 31 is then deposited, preferably by LPCVD, on the fill oxide layer 27 as shown in FIG. 6. The thickness of the second polish stop layer depends primarily on the polish selectivity of the CMP, but will usually be in the range 20–100 nm. The second polish stop layer is then masked with photoresist 33 as shown in FIG. 7. The second polish stop layer is to protect open areas of field oxide from dishing during the CMP, and the photoresist 33 therefore masks the field oxide in the trenches 25. The second nitride polish stop layer is then etched by plasma etch, and the photoresist stripped, leaving the polish stop pattern 35 shown in FIG. 8. The second patterned polish stop layer 35 is spaced laterally from the first patterned polish stop layer 23 by an intervening fill oxide layer 27. This lateral separation is desirable to ensure that the second polish stop layer does not overlap the first due, for example, to mask alignment errors but still substantially protects the field oxide. Accordingly, it is recommended that the photomasks for the first and second polish stop layers be designed to result in lateral spacing of at least 100 nm and preferably greater than 200 nm between the two polish stop layers.

Figure 9:
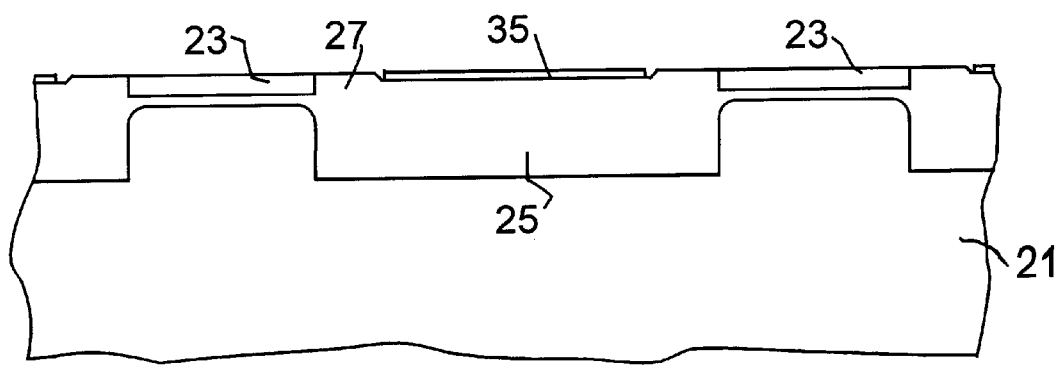
Figure 10:
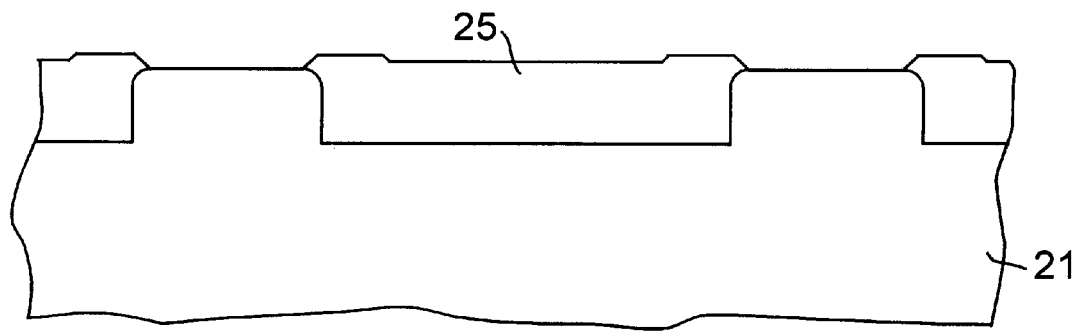

With the dual patterned polish stop layers in place the CMP step is then performed. A high selectivity slurry is recommended which polishes silicon dioxide quickly; but polishes silicon nitride slowly. It is preferred that the polish selectivity be at least 8, and preferably more than 30. A suitable polish slurry is XSHD3562, available from Rodel, Inc., Newark, Del. The CMP proceeds by eroding the fill oxide layer 27 from the high sites over the active device areas, while the field oxide in the trenches is protected by the second polish stop layer. As seen in FIG. 9, when the CMP step is completed, the fill oxide layer in the active device regions is essentially completely removed while the fill oxide layer in the trenches 25 is still intact. The remains of the first and second nitride polish stop layers is then removed, as shown in FIG. 10, by a wet etch, typically phosphoric acid, or by a plasma etch. This nitride etch is selective with respect to $SiO_2$. The $SiO_2$ pad oxide in the active device regions is then etched away, typically using an HF wet etch.

It should be evident, particularly with reference to FIG. 9, that the objective of using dual polish stop layers is to ensure that the active device areas of the silicon substrate can be exposed for device fabrication, the isolation material, i.e. the fill oxide, in the trenches is left intact, and the structure overall is relatively planar. This result follows if some portion of both polish stop layers remain after the CMP step as shown in FIG. 9. It is also beneficial if the top surfaces of both polish stop layers are essentially coplanar as shown in FIG. 9. To determine the ideal thicknesses, the CMP polish selectivity between the fill oxide and silicon nitride must be known. For example, given a fill oxide thickness of 480 nm and a selectivity of 8, the amount of the second polish stop layer that will be consumed during polishing of the fill oxide is 480/8, or 60 nm. It is suggested that a margin of at least 30% be used to guard against selectivity variations in the process. This adds approximately 20 nm to the suggested thickness of the second polish stop layer. If the fill oxide thickness is 20 nm below the top surface of the first nitride polish stop layer, (underfills by 20 nm), then the top surfaces of the polish stop layers will be essentially coplanar after completion of CMP. Following this example, it is suggested that the surface of the fill oxide, when deposition of this layer is complete, is below the top surface of the first polish stop layer by the margin built into the process, i.e. margin in %×thickness of the second polish stop layer that will be removed during CMP.

As evident from the foregoing discussion, to extract the optimum benefit from the dual polish stop layer process, it is desirable to have very high polish selectivity. If the selectivity is 30, the second polish stop layer can be relatively thin, e.g. 480/30=16 nm. Adding 20 nm for margin in this case would provide a process margin of 125%. Keeping the second polish stop layer relatively thin also avoids the possibility of shadowing features during the polish, which may happen if the surfaces of the first and second polish stop layers are very uneven.

Figure 11:
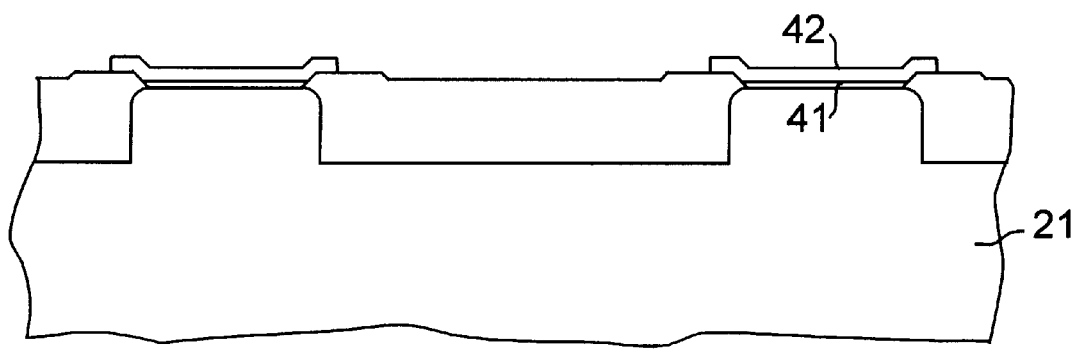

On completion of the polish stop and pad oxide removal, the active device regions are ready for device fabrication. FIG. 11 represents a typical fabrication process and shows gate dielectric 41 formed on the silicon substrate 21, and polysilicon gate 42 formed on the gate dielectric.

The use of silicon nitride as the polish stop layer as described above is the preferred embodiment of the invention. However, other etch stop materials may also be found suitable. Silicon nitride is occasionally deposited and used in the form of an oxynitride which may be suitable for use in this invention, and reference to a layer comprising silicon nitride is intended to include this material.

Reference herein and in the appended claims to masking selected portions of the first and second polish stop layer refers in the usual case to masking by photolithography but also is intended to include other mask technologies such as e-beam and x-ray.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A process for the manufacture of semiconductor integrated circuits comprising the steps of:
   a. depositing a first polish stop layer on a semiconductor substrate, said first polish stop layer comprising silicon nitride,
   b. masking first portions of said first polish stop layer with a first lithographic mask leaving second portions of said first polish stop layer exposed, said first portions being active device regions of said semiconductor substrate and said second portions being field oxide regions of said semiconductor substrate,
   c. etching the second portions of said first polish stop layer to form a patterned first polish stop layer,
   d. removing said first lithographic mask,
   e. etching the semiconductor substrate in said field oxide regions to form a plurality of trenches,
   f. depositing a gap filling dielectric on said semiconductor substrate, said gap filling dielectric covering said plurality of trenches and covering said patterned first polish stop layer,
   g. depositing a second polish stop layer on said gap filling dielectric, said second polish stop layer comprising silicon nitride,
   h. masking first portions of said second polish stop layer with a second lithographic mask, leaving second portions of said second polish stop layer exposed, said first portions of said second polish stop layer covering a major portion of said field oxide regions,
   i. etching said second portions of said second polish stop layer,
   j. removing said second lithographic mask,
   k. removing selected portions of said gap filling dielectric by chemical mechanical polishing, said selected portions being those portions of said gap filling dielectric covering said first polish stop layer, leaving said field oxide region.

2. The process of claim 1 wherein said gap filling dielectric is deposited with a thickness t, said first polish stop layer is deposited with a thickness $n_1$, and said plurality of trenches are etched to depth d, wherein t, $n_1$, and d are related by:

$$t \cong d + n_1.$$

3. The process of claim 1 wherein the semiconductor substrate is silicon.

4. The process of claim 3 wherein the fill oxide layer comprises $SiO_2$.

5. The process of claim 4 wherein said plurality of trenches have a depth d in the range 200–1000 nm.

6. The process of claim 5 wherein said first portions of said first polish stop layer and said first portions of said second polish stop layer are spaced by a distance of $\geq 100$ nm.

7. A process for the manufacture of silicon integrated circuits comprising the steps of:
   a. growing a pad oxide layer on a silicon substrate,
   b. depositing a first silicon nitride layer on said pad oxide layer, said first silicon nitride layer having a thickness in the range 30–300 nm,
   c. masking first selected portions of said first silicon nitride layer with a first lithographic mask leaving second selected portions of said first silicon nitride layer exposed, said first selected portions being active device regions of said silicon substrate and said second selected portions being field oxide regions of said silicon substrate,
   d. etching the second selected portions of said first silicon nitride layer to form a patterned first silicon nitride layer and expose selected portions of said pad oxide layer,
   e. removing said first lithographic mask,
   f. etching the exposed selected portions of said pad oxide layer, leaving selected portions of said silicon substrate exposed,
   g. etching the exposed selected portions of said silicon substrate in said field oxide regions to form a plurality of trenches,
   h. depositing a gap filling dielectric on said silicon substrate to cover said trenches and cover said patterned first polish stop layer, said gap filling dielectric having a thickness $T_1$,
   i. depositing a second silicon nitride layer on said gap filling dielectric,
   said second silicon nitride layer having a thickness $T_2$,
   j. masking first selected portions of said second silicon nitride layer with a second lithographic mask, leaving second selected portions of said second silicon nitride layer exposed, said first selected portions covering a major portion of said field oxide regions,
   k. etching said second selected portions of said second silicon nitride layer,
   l. removing said second lithographic mask, and
   m. removing selected portions of said gap filling dielectric by chemical mechanical polishing with a selectivity S that removes said gap filling dielectric at a rate of S times the rate at which it removes said first silicon nitride layer and said second silicon nitride layer, and wherein S is $\geq 8$ and is related to $T_1$ and $T_2$ by:

$$T_2 > T_1/S$$

said selected portions of said fill oxide layer being those portions of said gap filling dielectric covering said first silicon nitride layer, leaving said field oxide regions.

8. The process of claim 7 wherein $T_2$ is $\geq 1.3\ T_1/S$.

9. The process of claim 7 wherein the gap filling dielectric comprises $SiO_2$.

10. The process of claim 9 wherein the silicon substrate in step f is etched to a depth of 200–1000 nm.

11. The process of claim 7 wherein said first portions of said first silicon nitride layer and said first portions of said second silicon nitride layer are spaced by a distance of $\geq 200$ nm.

12. The process of claim 7 wherein a portion of said first silicon nitride layer and a portion of said second silicon nitride layer remain after step m.

* * * * *